(12) United States Patent
Patapoutian et al.

(10) Patent No.: US 11,817,124 B2
(45) Date of Patent: Nov. 14, 2023

(54) COMPOSITE DATA RECOVERY PROCEDURE

(71) Applicant: Seagate Technology LLC, Fremont, CA (US)

(72) Inventors: Ara Patapoutian, Rancho Santa Fe, CA (US); Jason Charles Jury, Apple Valley, MN (US)

(73) Assignee: Seagate Technology LLC, Fremont, CA (US)

( * ) Notice: Subject to any disclaimer, the term of this patent is extended or adjusted under 35 U.S.C. 154(b) by 149 days.

(21) Appl. No.: 17/542,875

(22) Filed: Dec. 6, 2021

(65) Prior Publication Data

US 2023/0178109 A1 Jun. 8, 2023

(51) Int. Cl.
| | |
|---|---|
| *G11B 20/18* | (2006.01) |
| *G11C 29/42* | (2006.01) |
| *G11B 19/04* | (2006.01) |
| *G11C 29/52* | (2006.01) |
| *H04L 43/024* | (2022.01) |
| *H03M 13/37* | (2006.01) |

(Continued)

(52) U.S. Cl.
CPC ...... *G11B 20/1876* (2013.01); *G11B 20/1803* (2013.01); *G06F 2211/109* (2013.01); *G11B 7/094* (2013.01); *G11B 19/041* (2013.01); *G11B 20/1258* (2013.01); *G11B 20/18* (2013.01); *G11B 20/1816* (2013.01); *G11B 2020/1222* (2013.01); *G11C 29/42* (2013.01); *G11C 29/52* (2013.01); *H03M 13/3715* (2013.01); *H04L 43/024* (2013.01)

(58) Field of Classification Search
CPC .......... G06F 2211/109; H03M 13/3715; G11C 29/52; G11C 29/42; G11B 20/1816; G11B 20/18; G11B 2020/1222; G11B 19/041; G11B 7/094; G11B 20/1258; G11B 20/1876; G11B 20/1803; H04L 43/024
See application file for complete search history.

(56) References Cited

U.S. PATENT DOCUMENTS

| | | |
|---|---|---|
| 8,745,318 B2 | 6/2014 | Rub et al. |
| 9,015,549 B2 | 4/2015 | Rub et al. |
| 9,190,104 B2 | 11/2015 | Yang et al. |

(Continued)

OTHER PUBLICATIONS

U.S. Appl. No. 17/410,840, filed Aug. 24, 2021, "Read Offset Calibration for Error Recovery", 30 pages.

(Continued)

*Primary Examiner* — April Y Blair
*Assistant Examiner* — Sazzad Hossain
(74) *Attorney, Agent, or Firm* — Westman, Champlin & Koehler, P.A.

(57) ABSTRACT

A method of recovering data from one or more failed data sectors includes estimating a reader offset position from a first or a second read attempt of the one or more failed data sectors at a current set of channel parameters and basing the estimated reader offset position on, at least in part, a position error signal generated during the first or second read attempt. At least one read is performed on the one or more failed data sectors at the estimated reader offset position to obtain one or more samples. The one or more samples are processed to obtain a processed sample. Iterative outer code recovery is performed on the processed sample.

20 Claims, 11 Drawing Sheets

(51) Int. Cl.
  *G11B 7/09*   (2006.01)
  *G11B 20/12*  (2006.01)

(56) References Cited

U.S. PATENT DOCUMENTS

| | | |
|---|---|---|
| 9,396,062 B1 | 7/2016 | Sridhara et al. |
| 10,140,180 B1 | 11/2018 | Sridhara et al. |
| 10,177,791 B1 | 1/2019 | Sridhara et al. |
| 10,382,065 B1 | 8/2019 | Sridhara et al. |
| 10,719,392 B1 | 7/2020 | Sridhara et al. |
| 11,042,439 B1 | 6/2021 | Sridhara et al. |
| 11,121,729 B1 | 9/2021 | Sridhara et al. |
| 2008/0074778 A1* | 3/2008 | Annampedu .......... G11B 20/18 360/77.08 |
| 2010/0134917 A1* | 6/2010 | Sakai ................ G11B 5/59627 360/77.02 |
| 2010/0246043 A1* | 9/2010 | Barsotti ............. G11B 5/00817 |
| 2019/0340069 A1* | 11/2019 | Kumar ................ H03M 13/45 |

OTHER PUBLICATIONS

U.S. Appl. No. 17/466,327, filed Sep. 3, 2021 "Read Offset Calibration for Error Recovery", 36 pages.
U.S. Appl. No. 17/469,301, filed Sep. 8, 2021 "Multi-Sector Read Offset Recovery", 24 pages.

* cited by examiner

COMPOSITE DATA RECOVERY PROCEDURE

SUMMARY

A method of recovering data from one or more failed data sectors is provided. A reader offset position is estimated from a first or a second read attempt of the one or more failed data sectors at a current set of channel parameters and is based, at least in part, on a position error signal generated during the first or second read attempt. At least one read is performed on the one or more failed data sectors at the estimated reader offset position to obtain one or more samples. The one or more samples are processed to obtain a processed sample. Iterative outer code recovery is performed on the processed sample.

A method of recovering data from one or more failed data sectors is provided. A reader offset position is estimated from a first or a second read attempt of the one or more failed data sectors at a current set of channel parameters and is based, at least in part, on a position error signal generated during the first or second read attempt. The current set of channel parameters are replaced with a new set of channel parameters selected from adaptive channel parameters or predetermined channel parameters. At least one read is performed on the one or more failed data sectors at the estimated reader offset position and using the new set of channel parameters to obtain one or more samples. The one or more samples are processed to obtain a processed sample. Iterative outer code recovery is performed on the processed sample.

A method of recovering data from one or more failed data sectors is provided. A reader offset position is estimated from a first or a second read attempt of the one or more failed sectors at a current set of channel parameters and is based, at least in part, on a position error signal generated during the first or second read attempt. The current set of channel parameters are replaced with a new set of channel parameters selected from adapative channel parameters or predetermined channel parameters. Multiple reads are performed on the one or more failed data sectors at the estimated reader offset position and using the new set of channel parameters to obtain a plurality of samples. The plurality of samples are processed to obtain a processed sample. Interference is removed from the processed sample to obtain an updated processed sample. Interference is derived from an adjacent track having one or more data sectors that are adjacent to the one or more failed data sectors.

This summary is not intended to describe each disclosed embodiment or every implementation of composite data recovery procedures as described herein. Many other novel advantages, features, and relationships will become apparent as this description proceeds. The figures and the description that follow more particularly exemplify illustrative embodiments.

DETAILED DESCRIPTION

Figure 1:
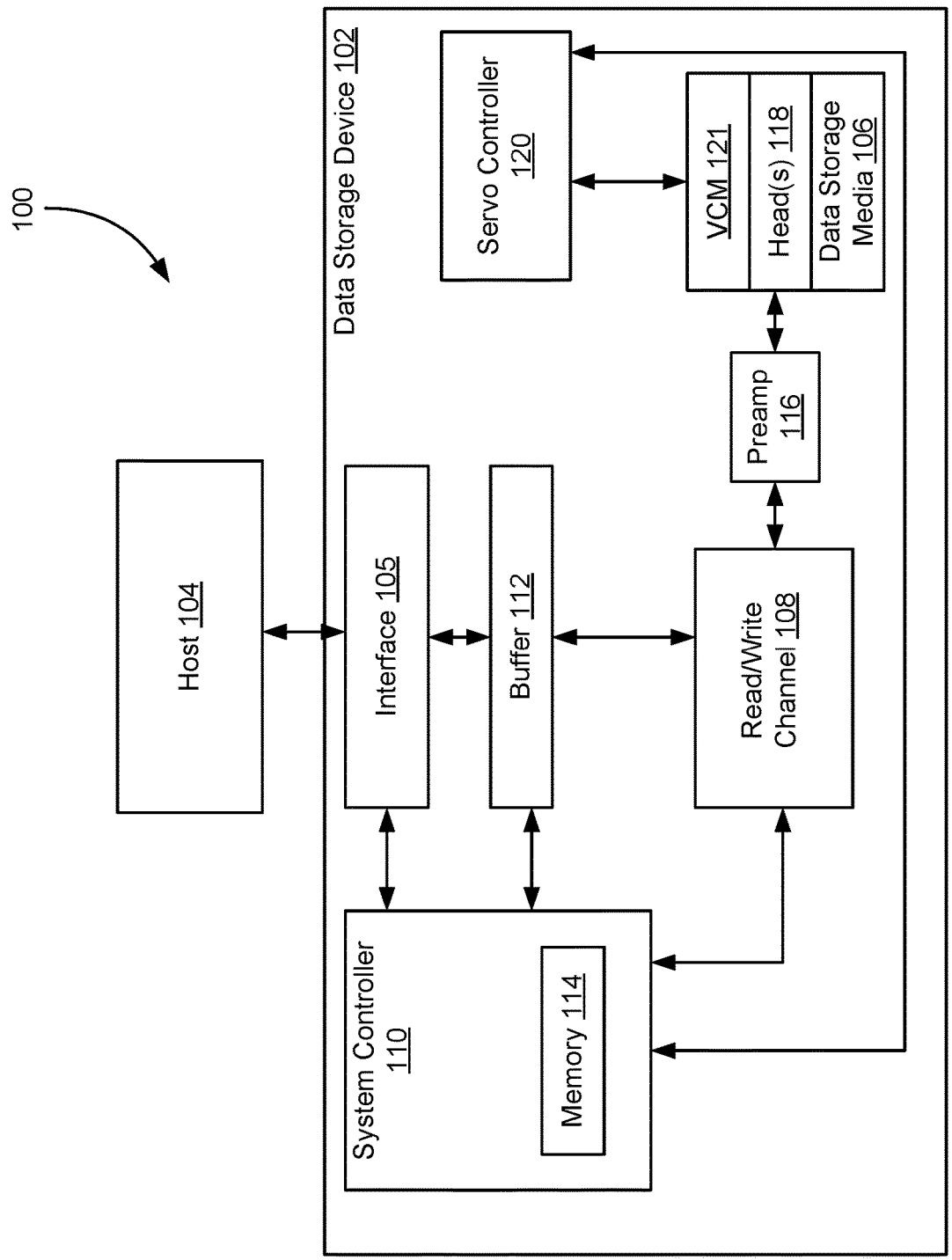
FIG. 1 is a diagram of a data storage system configured to perform data recovery in accordance with embodiments.

Embodiments of the disclosure generally relate to combining individual types of data recovery or error recovery into a composite data recovery procedure in such a way that the effectiveness in data recovery is significantly larger than the sum of the individual gains from each individual of data recovery. At each step, the composite data recovery procedure builds on previous recoveries rather than restarts a new one. FIG. 1 illustrates a block diagram of an exemplary data storage system 100 in which embodiments disclosed herein may be incorporated. The operating environment shown in FIG. 1 is for illustration purposes only. Embodiments of the present disclosure are not limited to any particular environment such as the operating environment shown in FIG. 1. Rather, embodiments are illustratively practiced within any number of different types of operating environments.

It should be noted that like reference numerals are used in different figures for same or similar elements. It should also be understood that the terminology used herein is for the purpose of describing embodiments, and the terminology is not intended to be limiting. Unless indicated otherwise, ordinal numbers (e.g., first, second, third, etc.) are used to distinguish or identify different elements or steps in a group of elements or steps, and do not supply a serial or numerical limitation on the elements or steps of the embodiments thereof. For example, "first," "second," and "third" elements or steps need not necessarily appear in that order, and the embodiments thereof need not necessarily be limited to three elements or steps. It should also be understood that, unless indicated otherwise, any labels such as "left," "right," "front," "back," "top," "bottom," "forward," "reverse," "clockwise," "counter clockwise," "up," "down," or other similar terms such as "upper," "lower," "aft," "fore," "vertical," "horizontal," "proximal," "distal," "intermediate" and the like are used for convenience and are not intended to imply, for example, any particular fixed location, orientation, or direction. Instead, such labels are used to reflect, for example, relative location, orientation, or directions. It should also be understood that the singular forms of "a," "an," and "the" include plural references unless the context clearly dictates otherwise.

It will be understood that, when an element is referred to as being "connected," "coupled," or "attached" to another element, it can be directly connected, coupled or attached to the other element, or it can be indirectly connected, coupled, or attached to the other element where intervening or intermediate elements may be present. In contrast, if an element is referred to as being "directly connected," "directly coupled" or "directly attached" to another element, there are no intervening elements present. Drawings illustrating direct connections, couplings or attachments between elements also include embodiments, in which the elements are indirectly connected, coupled or attached to each other.

FIG. 1 is a diagram of a data storage system 100 configured to perform data recovery in accordance with embodiments of the present disclosure. System 100 may include a data storage device 102, such as a storage drive (e.g. a hard disc drive (HDD) or hybrid drive) or any other device which may be used to store or retrieve data. System 100 may include a host device 104, which may also be referred to as the host system or host computer. Host 104 can be a desktop computer, a laptop computer, a workstation, a tablet computer, a telephone, a music player, another electronic device, or any combination thereof. Host 104 and data storage device 102 may be coupled or connected by way of a wired or wireless connection, or by a local area paranetwork (LAN) or wide area network (WAN). In some embodiments, the data storage device 102 can be a stand-alone device not connected to a host 104 (e.g. a removable data storage device having its own case or housing), or host 104 and data storage device 102 may both be part of a single unit (e.g. a computer having an internal hard drive). Host 104 may issue data access requests, such as read or write requests, to data storage device 102. In response, data storage device 102 may perform data access operations based on the requests.

Data storage device 102 communicates with host device 104 via a hardware or firmware-based interface circuit 105. Interface 105 may comprise any interface that allows communication between a host 104 and data storage device 102, either wired or wireless, such as USB, IEEE 1394, Compact Flash, SATA, eSATA, PATA, SCSI, SAS, PCIe, Fibre Channel, Ethernet, or Thunderbolt, among others. Interface 105 may include a connector (not shown) that allows the data storage device 102 to be physically removed from host 104. Data storage device 102 may have a casing housing the components of data storage device 102.

Data storage device 102 includes a memory in the form of one or more data storage media 106, a read/write (R/W) channel 108, and a system controller 110. One or more data storage media 106 may include magnetic storage media like hard discs, solid state memory like Flash, other types of memory, or a combination thereof. Data storage device 102 may include additional memory instead of or in addition to data storage media 106. For example, additional memory can be a solid state memory, which can be either volatile memory such as DRAM or SRAM, or non-volatile memory, such as NAND Flash memory. The additional memory can function as a cache and store recently or frequently read or written data, or data likely to be read soon. Additional memory may also function as main storage instead of or in addition to media 106. A buffer 112 can temporarily store data during read and write operations, and can include a command queue where multiple pending operations can be temporarily stored pending execution. Commands arriving over interface 105 may automatically be received in the command queue or may be stored there by system controller 110, interface 105, or another component.

Data storage media 106 may include a plurality of data units. Each data unit may be subdivided into a plurality of storage segments. As defined herein, a storage segment may be the basic unit of data storage on data storage media 106. The storage segments may be identified and located at various positions on data storage medium 106.

Figure 2:
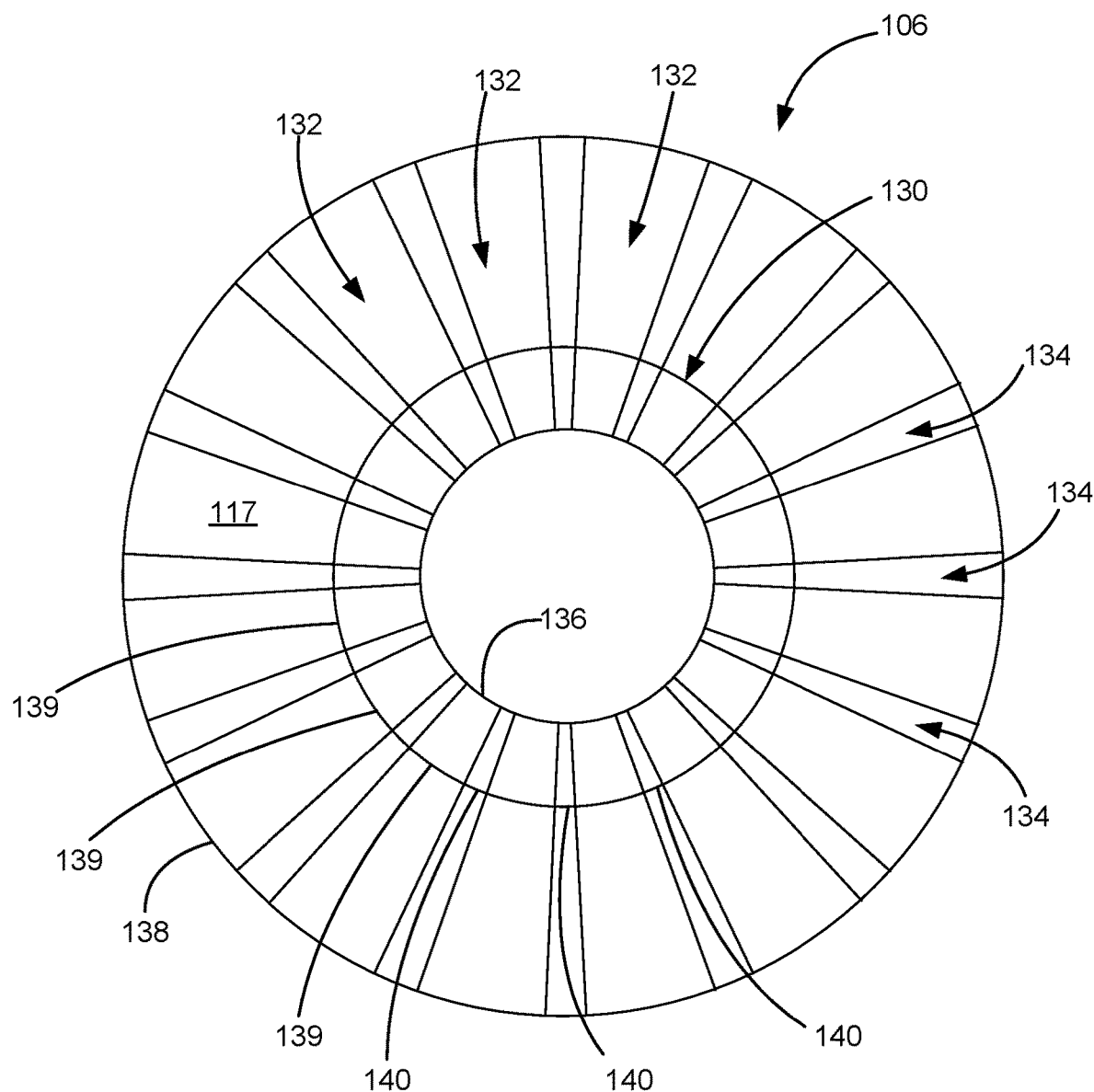
FIG. 2 is an exemplary top view of a storage medium in accordance with embodiments.

FIG. 2 illustrates a top view of an exemplary disc storage medium 106 in accordance with embodiments of the present disclosure. In FIG. 2, storage medium 106 may include a surface 117 having a plurality of substantially concentric circular tracks (e.g., data units), such as exemplary data track 130. Data is written to magnetic recording medium 106 along the data tracks, which may be sequentially numbered in accordance with their radial position. Each track of medium 106 can include user data regions 132 and servo data regions 134 (sometimes referred to as servo wedges) positioned between the user data regions 132. Servo wedges 134 extend radially between an inner diameter 136 and an outer diameter 138 of medium 106. The portion of the data tracks in user data regions 132 comprise data sectors 139 and store user data, and the portion of the data tracks in the servo wedges 134 comprise servo sectors 140, which store servo data. As such, each servo wedge 134 includes a plurality of servo sectors 140.

Referring back to FIG. 1, system controller 110 may be a processor or circuit, which can include programming stored in memory 114, and is configured to control data access operations, such as read and write operations, to one or more data storage media 106. RAY channel 108 may be a digital communications channel comprising one or more circuits or processors configured to process signals for recording data to or reading data from media 106. Data retrieved from media 106, or to be stored to media 106, may be processed via R/W channel 108, such as by encoding or decoding signals, detecting values from signal waveforms, or other processing. For example, RAY channel 108 can encode data during write operations and reconstruct user data retrieved from media 106 during read operations. A preamplifier circuit (preamp) 116 can apply write currents to the head(s) 118 and provides pre-amplification of read-back signals. In some embodiments, preamp 116 and head(s) 118 may be considered part of R/W channel 108.

Figure 3:
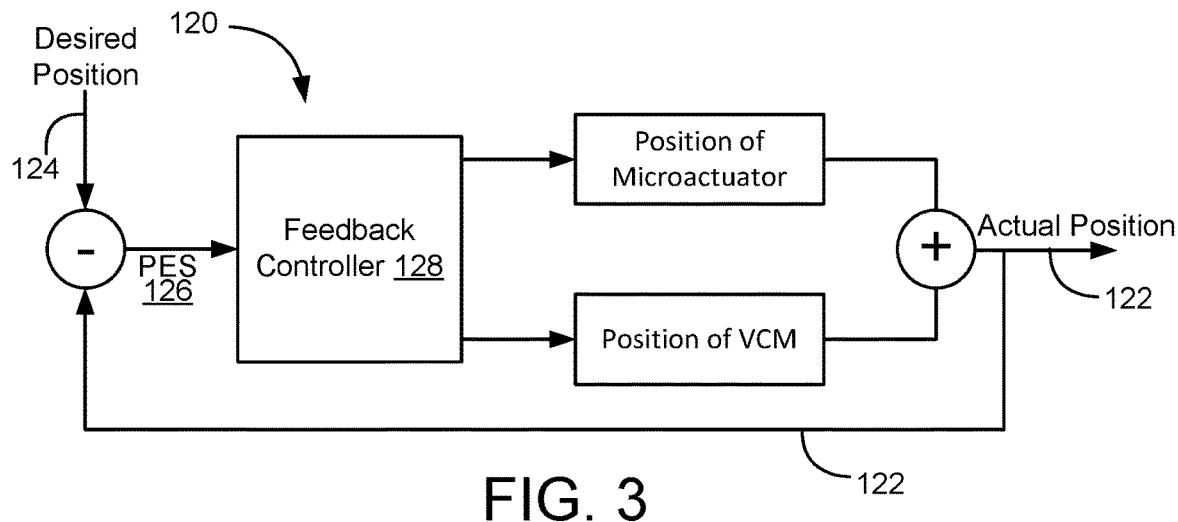
FIG. 3 is a schematic diagram of a servo control system in accordance with embodiments.

FIG. 3 is a schematic diagram illustrating a servo controller circuit 120 (also shown in FIG. 1) in accordance with embodiments of the present disclosure. A servo controller circuit 120 may use servo or positioning data to provide the appropriate current to coil 121 (FIG. 1), sometimes called a voice coil motor (VCM), to position head(s) 118 (FIG. 1) over a desired area of data storage media 106. System controller 110 can communicate with servo controller 120 to move head(s) 118 to the desired locations on the media 106 during execution of various pending commands. In operation, read/write heads 118 read positioning data from servo sectors stored on media 106. The read positioning data is processed to determine an actual position of read/write heads 118 relative to tracks. As illustrated, the actual position 122 of read/write heads 118 is subtracted from a desired position 124 of read/write heads 118 to determine a position error signal (PES) 126, which is the difference between where read/write heads 118 are and should be positioned.

PES 126 is fed into a feedback controller 128, which controls current to at least one of VCM 121 and, for some operations, controls voltage to microactuators to position read/write heads 118 over the desired track.

Data storage device 102 also includes error recovery or data recovery, which may be carried out by system controller 110, R/W channel 108, or otherwise included in data storage device 102. During data read operations, data storage device 102 may fail to read data from media 106 due to errors, for example due to flaws in the physical storage medium, due to errors that occurred when the data was written, or due to errors during the read operation. Error recovery may be used to recover data that could not be read during a read operation. Error recovery may be performed by a processor, controller or other circuit, or it may be a set of software instructions that, when executed by a processing device, perform error recovery functions.

In a data storage device, there are multiple different data recovery types or schemes that may improve the data recovery of a sector of a data storage media. For example, retrying or rereading the data sector 139, averaging the samples from multiple retries of rereading the data sector 139, replacing parameters of R/W channel 108, modifying the reader off-track position (reader offset), removing adjacent track interference from data sector 139 and performing iterative outer code recovery. It is common to use each recovery scheme listed above independently, where, if a data recovery scheme fails, parameters are reset to their previous or original values. As described above, embodiments of the disclosure provide a composite data recovery procedure that combines data recovery schemes. In particular, a data recovery scheme builds on a previously performed data recovery scheme in such a way that the effectiveness in data recovery is significantly larger than the sum of the individual gains from each individual data recovery step.

Figure 4:
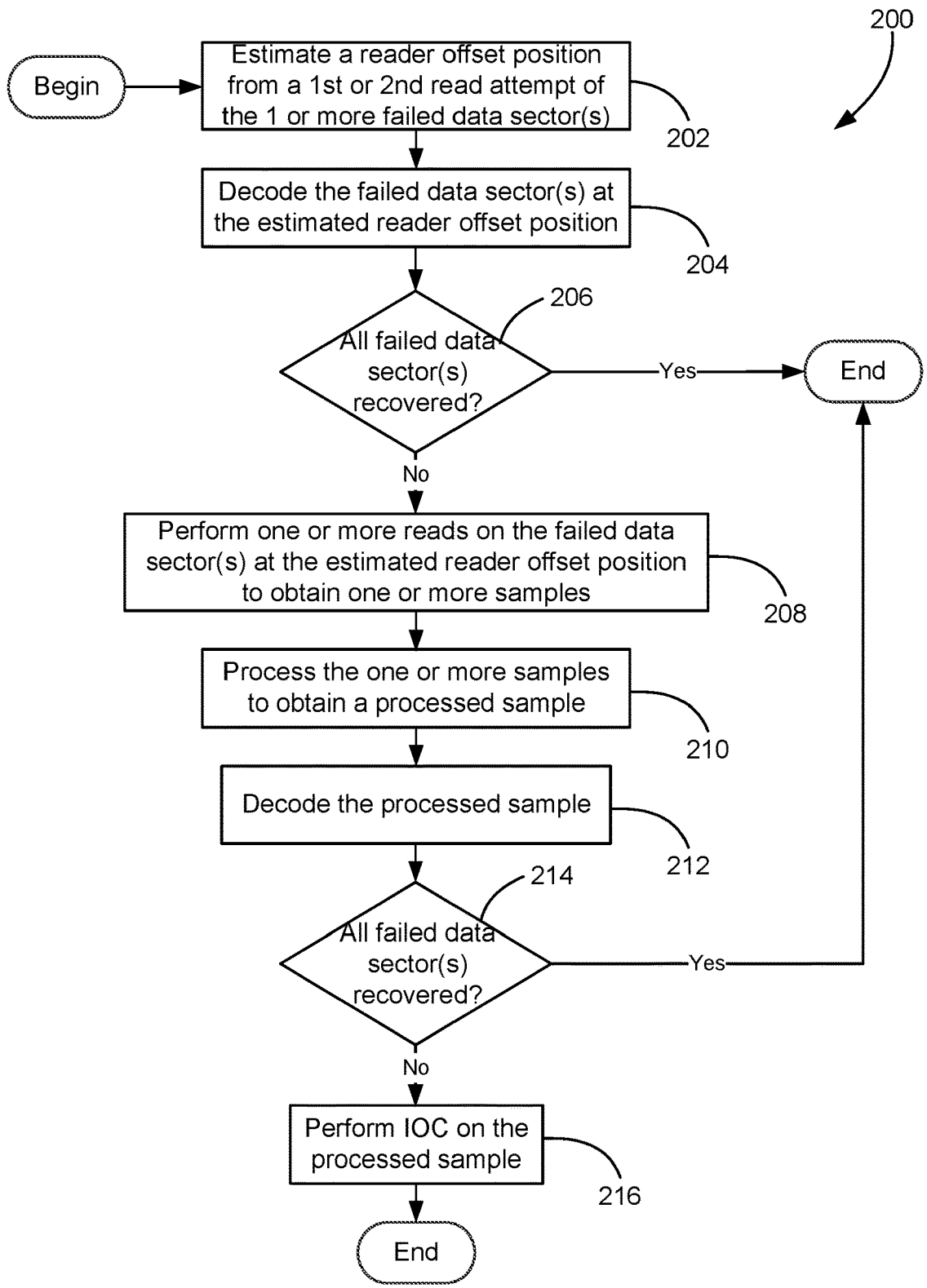
FIG. 4 illustrates a composite data recovery procedure according to an embodiment.

FIG. 4 illustrates a composite data recovery procedure 200 according to one embodiment. Composite data recovery procedure 200 is initiated upon detection of one or more failed data sectors on a first read attempt. At block 202, a reader offset position is estimated from the first read attempt or from a second read attempt of the one or more failed data sector(s) at a current set of channel parameters and is based, at least in part, on a position error signal generated during the first or a second read attempt. RAY channel 108, preamplifier 116 and various components of system controller 110 operate so that the servo data read by read/write heads 118 can be processed and used by data storage device 102 to maintain proper positioning of read/write heads 118. The following describes the estimating of reader offset position described in block 202 in more detail.

Figure 5:
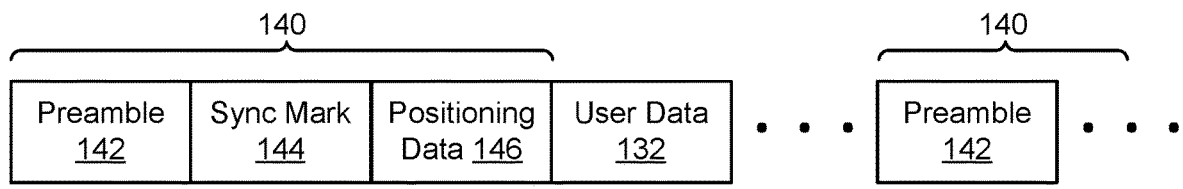
FIGS. 5-8 illustrate partial ribbon schematics of a data track in accordance with certain embodiments.

FIG. 5 illustrates an example of the type of servo data stored in servo sectors 140. Servo sectors 140 can include a preamble 142 (e.g., a fixed pattern dictating the beginning of the servo sector 140) followed by what may be referred to as a sync mark 144 (e.g., a synchronization pattern) or servo timing mark. For example, preamble 142 may be written with an alternating pattern of magnetic transitions which, when read, generates a sine-wave like read-back signal. When the servo control system identifies preamble 142, servo controller 120 may then search for an expected sync mark 144. Once sync mark 144 is detected, servo controller 120 can read positioning data 146 following sync mark 144 from servo sectors 140. Positioning data 146 specifies the physical radial and tangential location of the given servo sector 140 on media 106. As read/write heads 118 pass over each servo sector 140, the servo sector's information is demodulated such that the position of read/write heads 118 is known. The detected actual position of read/write heads 118 is used by servo controller 120 to determine and correct when the actual position is suboptimal.

Figure 6:
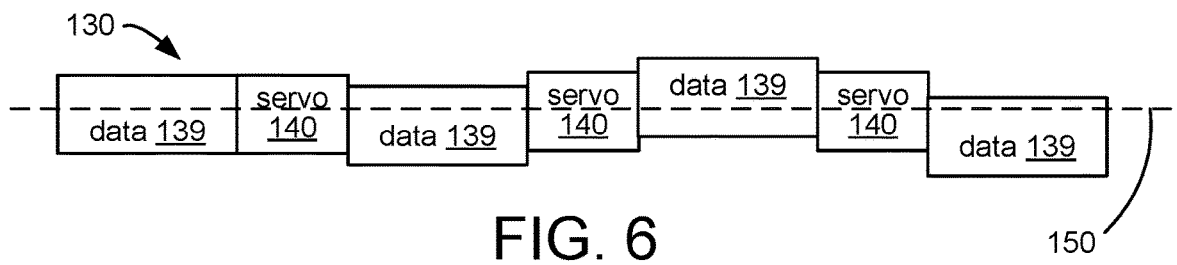

FIG. 6 illustrates a partial, ribbon view of data track 130 (FIG. 2) for magnetic recording medium 106 (FIGS. 1 and 2). Magnetic recording medium 106 may have millions of data tracks stored on it. Exemplary data track 130 has a centerline 150. In some embodiments, centerline 150 is the average centerline of data sectors along data track 130. Data track 130 includes data sectors 139 positioned between servo sectors 140. Many data sectors 139 can be positioned along data track 130 in the section with user data 132 (FIGS. 2 and 5). As such, there can be multiple distinct data sectors 139 (e.g., data sectors with unique addresses) positioned between servo sectors 140 along data track 130. In FIG. 6, at least some data sectors 139 and servo sectors 140 may be offset (e.g., radially offset) from centerline 150 of each data track 130. For example, the centerline of a given sector may be offset from (e.g., not aligned with) centerline 150 of data track 130. As noted above, the misalignment may cause errors when attempting to read data from misaligned data sectors 139.

Figure 7:
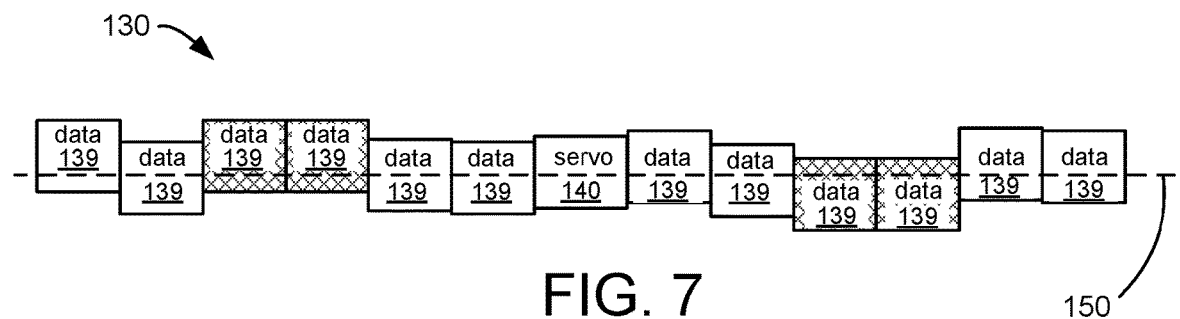

FIG. 7 illustrates a more granular view of two sets of consecutive data sectors 139 with one servo sector 140 (e.g., a portion of a servo wedge) positioned between the two sets of data sectors 139 on data track 130. As shown, data sectors 139 are not perfectly aligned along centerline 150 of data track 130. Instead, some data sectors 139 may have their centerlines positioned above centerline 150 and therefore closer to outer diameter 138 (FIG. 2) of magnetic recording medium 106, while other data sectors 139 may have their centerlines positioned below centerline 150 and therefore closer to inner diameter 136 (FIG. 2) of magnetic recording medium 106.

In FIG. 7, the data sectors that are filled with crosshatch represent data sectors that caused an initial read error as the read transducer of the read/write head 118 attempted to read data from data track 130. Because of the initial read error, system controller 110 of data storage device 102 may be programmed to reread the data sectors that caused an initial read error (sometimes called failed data sectors). However, as noted above, attempting to follow the same path along centerline 150 of data track 130 may result in failing to read the same failed data sectors.

Some reread approaches involve offsetting read/write head 118 a predetermined amount in a positive direction or negative direction, attempting to reread the failed data sectors, offsetting read/write head 118 in an opposite direction, and again attempting to reread the failed data sectors. However, this approach takes multiple revolutions of magnetic recording medium 106 and still may not result in successful reading of the failed data sectors.

In block 202 of FIG. 4, procedure 200 retries reading or decoding data of failed data sector(s) in a single revolution by estimating a reader offset position. In short, a customized path (e.g. trajectory) for the read transducer of read/write head 118 is generated based on estimated read offsets of each failed data sector. This customized path attempts to more closely align the read transducer with centerlines of failed data sectors.

Using the FIG. 7 example, in attempting to read data from data track 130, read/write head 118 is positioned such that a read transducer attempts to follow centerline 150 of data track 130. As noted above, during the initial read operation, data from some of data sectors 139 may be missed due to one or more of the data sectors 139 being offset from centerline 150 of data track 130. In FIG. 7, these missed data sectors 139 are in crosshatch.

System controller 110 of data storage device 102 may determine that certain data sector(s) 139 are not successfully read. These missed data sector(s) 139 can be distributed throughout data track 130. For example, as shown in FIG. 7, the missed data sector(s) 139 may be non-consecutive (e.g., separated by data sectors 139 successfully read) with respect to each other. Further, the missed data sector(s) 139 may be positioned in different sections of user data. For example one or more missed data sector(s) 139 may be positioned on one side of servo sector 140 while another one or more missed data sector(s) 139 may be positioned on the other side of servo sector 140.

Once system controller 110 detects a missed data sector 139, the system controller may determine that a read error has occurred and initiate procedure 200. At block 202, procedure 200 estimates an offset position of each of the missed data sectors 139 during the first read attempt. In some embodiments, the estimated offset position includes a direction (e.g., positive or negative radial direction with respect to centerline 150) and an offset amount. The offset amount can be determined in terms of a percentage of a pitch of data track 130. The offset amount can attempt to estimate a difference between centerline 150 of data track 130 and respective centerlines of the missed data sectors 139. Separate offset positions can be estimated for each missed data sector 139.

In some embodiments, the offset positions of the missed data sector(s) 139 are estimated based on information collected during the first read attempt. For example, the offset positions can be based, at least in part, on a position error signal generated during the first attempt at reading data sector(s) 139. In some embodiments, the offset position of the missed data sector(s) 139 are estimated based on information collected during a subsequent or second attempt at reading data sectors 139. The subsequent or second read attempt may be a read-retry operation initiated once a read error is detected. Waiting until the subsequent or second read attempt can help address errors caused by factors such as seek-settle effects. However, waiting may increase the overall time consumed by the error recovery process.

In other embodiments, the offset positions of the missed data sector(s) 139 are estimated based on information collected either during the first read attempt or during a subsequent or second read attempt of data sector(s) 139. For example, when an error is detected while carrying out a sequential read (during which seek-settle effects are limited), the offset positions may be estimated using information collected during the first read attempt rather than a subsequent or second read attempt. In another example, information from the first read attempt is used when the detected error is associated with a data sector positioned in the last half of data track 130. In this example, read/write head 118 is likely to have settled by the time the later data sector is read, so the information collected during the first read attempt is not largely affected by seek-settle issues.

U.S. patent application Ser. No. 17/410,840 (filed Aug. 24, 2021) and Ser. No. 17/466,327 (filed Sep. 3, 2021) describe approaches and techniques for estimating offset positions and are hereby incorporated by reference for such purposes.

Figure 8:

FIG. 8 illustrates data track 130 and only the missed data sector(s) 139 from FIG. 7. Using the estimated offset positions, system controller 110 generates a new path 151 (e.g. trajectory) for the read transducer of read/write head 118 to follow while attempting to reread the missed data sector(s) 139. New path 151 can attempt to pass over estimated centers of missed data sector(s) 139 which helps increase the chance that data from missed data sector(s) 139 can be successfully read. As shown in FIG. 8, new path 151 can pass through data sector(s) 139 offset above and below centerline 150 of data track 130 as well as data sector(s) 139 that are not immediately adjacent to each other. In some embodiments, new path 151 will pass through multiple data sector(s) 139 at different offset locations on only one side of centerline 150 of data track 130. Regardless of the specific path taken, new path 151 allows for rereading and recovering data from multiple data sector(s) 139 (consecutive or non-consecutive) during a single revolution of magnetic recording medium 106.

U.S. patent application Ser. No. 17/469,301 (filed Sep. 8, 2021) describes approaches and techniques for multi-sector (consecutive or non-consecutive) reader offset positioning and is hereby incorporated by reference for such purposes.

After estimating a reader offset position, procedure 200 passes to block 204 and decodes the failed data sector(s) 139 at the estimated reader offset position or at new path 151. At block 206, if all of the failed data sector(s) 139 are recovered, procedure 200 ends. If one or more failed data sector(s) 139 are not recovered, procedure 200 passes to block 208.

A block 208, one or more reads on the failed data sector(s) 139 at the estimated reader offset position are performed to obtain one or more samples. At block 210, the one or more samples are processed to obtain a processed sample. Under one embodiment, the processing of multiple samples may include averaging the multiple samples of the read waveform. For example, averaging multiple samples may be generated by X-averaging, SERV-averaging and/or recursive read averaging (RRA). X-averaging includes finite impulse response filter (FIR) samples resulting from analog-to-digital converter (ADC) averaged samples. In SERV-averaging, multiple equalized samples may be combined (e.g., FIR averaged). In RRA, samples are combined or averaged together in a particular manner, such as by using maximum-ratio combining to increase the signal-to-noise and yield better read samples to provide to a detector and decoder. In other words, RRA averages multiple noise realization together, to improve signal quality. In another embodiment, processing of the one or more samples described in block 210 may also include keeping the best sample of the one or more samples and the averaged sample. In other words, each sample that was read is compared to each other and to the averaged sample and the best sample is selected in the comparison to become the processed sample. Therefore, the processed sample may be a result of the one or more reads on the failed data sector(s) or it may be the averaged sample from the multiple reads on the failed data sector(s).

At block 212, the processed sample is decoded and passed to block 214. At block 214, if all the failed data sector(s) 139 are recovered, procedure 200 ends. If one or more of the failed data sector(s) 139 are not recovered, procedure 200 passes to block 216 so that iterative outer code (IOC) data recovery may be performed on the processed sample. As previously discussed, the processed sample was read at the estimated reader offset position.

Figure 9:
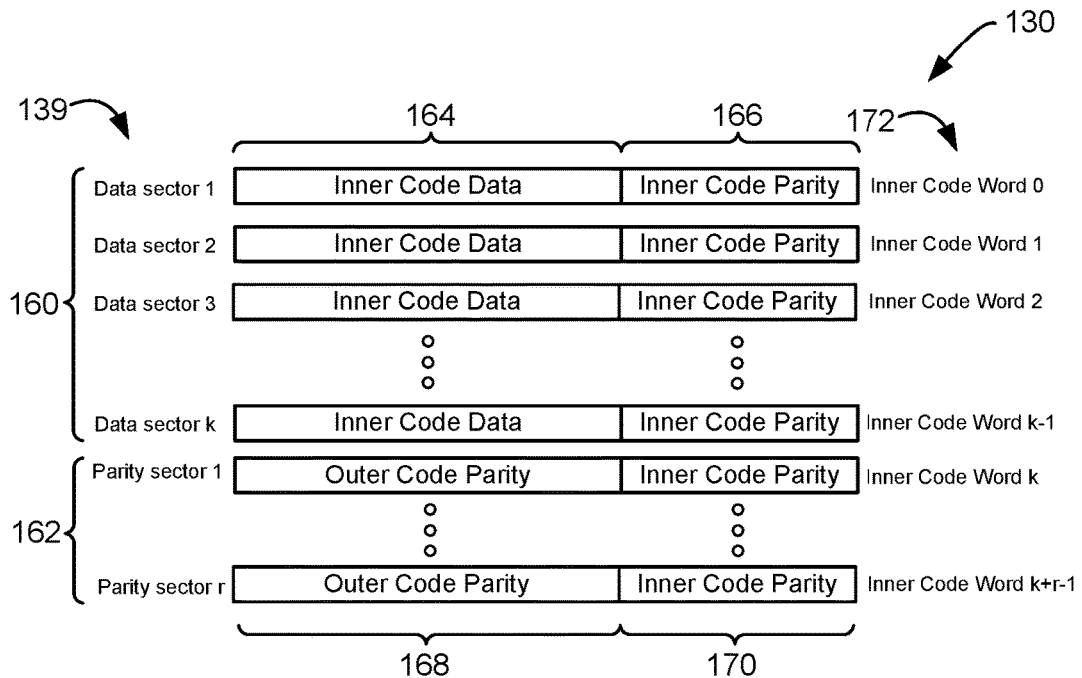
FIG. 9 illustrates a diagrammatic view of a data unit and its organized groupings of data into inner and outer codes in accordance with certain embodiments.

FIG. 9 illustrates a diagrammatic view of data track 130 and the organization of groupings of data into inner and outer codes according to an embodiment. As previously discussed, data track 130 includes a plurality of data sectors 139 for storing user data. However, in this embodiment, data sectors 139 also may store parity data. The rows in FIG. 9 represent data sectors 139 in data track 130 and may also represent one grouping in the first set of groupings being encoded by an inner code.

Sectors 139 may be further divided into k number of sectors 160 and r number of sectors 162, wherein k and r may be integers greater than or equal to 1. Each of the k number of sectors 160 may include a first portion 164, which may contain user data encoded by the inner code. Each of the k number of sectors 160 may also include a second portion 166, which may contain inner code parity data encoded by an inner code. This inner code parity 166 may provide inner code protection against errors in the sector to which it belongs. More specifically, inner code parity 166 may provide protection against errors in the inner code data 164. Recovery using inner code parity may be referred to inner code recovery herein.

Each of the r number of sectors 162 may include a first portion 168, which may contain parity data encoded by the outer code. Each of the r number of sectors 162 may also include a second portion 170, which may contain inner code parity data encoded by the inner code. The outer code parity 168 may provide outer code protection against inner code failures, while the inner code parity 170 of r number of sectors 162 may provide inner code protection against errors in the segment to which it belongs. More specifically, the inner code parity 170 may provide protection against errors in the outer code parity 168. Therefore, each row of sectors may be considered to be an inner code word 172 starting with inner code word 0 and ending with inner code word k+r−1. Recovery of sectors using outer code parity may be referred to herein as outer code recovery.

Any number of sectors 162 (as represented by rows) may be provided for the outer code. The more sectors that are provided for the outer code, the more errors that may be detected and may be corrected by the outer code parity 168. However, increasing the number of sectors for the outer code and thereby increasing the number of parity data symbols, may come at the cost of reduced storage capacity of user data. It should be realized that errors may occur both in sectors 160 as well as in sectors 162.

In some embodiments, each of the plurality of sectors 139 that may be indicated by a row in FIG. 9 is associated with a logical block address (LBA). Each LBA may designate an address for the row of inner code data and inner code parity on a storage medium. In embodiments in which a magnetic disc provides the storage medium, the LBA can be the LBA of a data sector of a data track on the storage medium.

Figure 10:
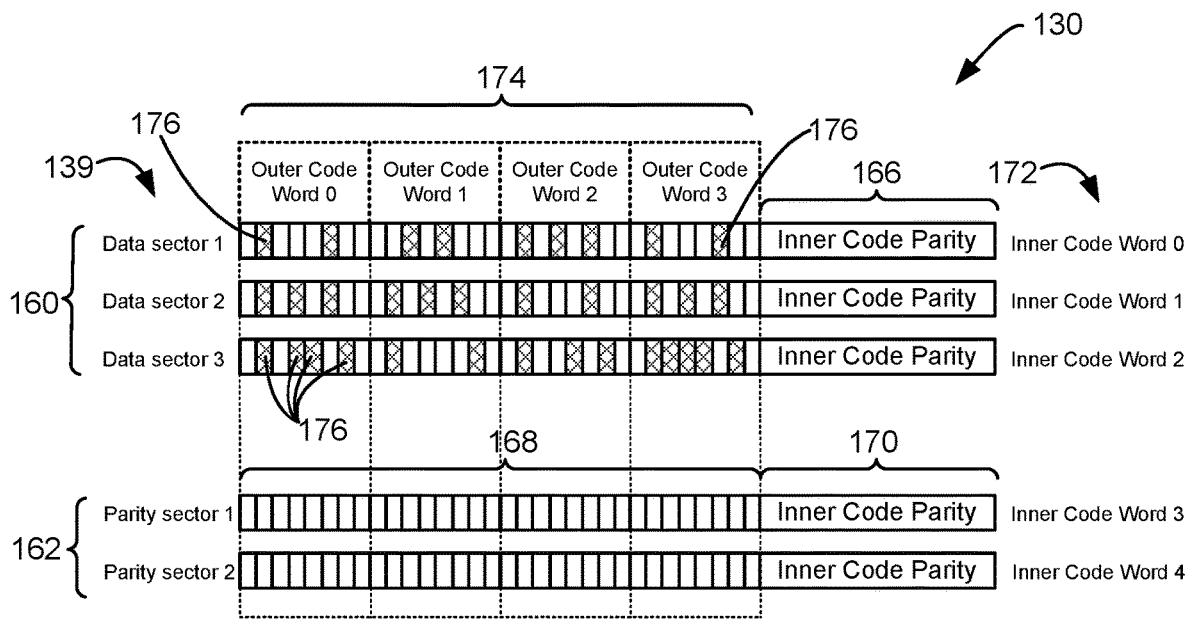
FIG. 10 illustrates a diagrammatic view of a data unit and its organized groupings of data into inner and outer codes based on a Reed-Solomon scheme in accordance with certain embodiments.

FIG. 10 illustrates a diagrammatic view of data track 130 and one embodiment of the organization of groupings of data into inner code 166 and 170 and outer code 168 based on a Reed-Solomon (RS) scheme. With a RS outer code, the unit of correction may be a symbol. A symbol may contain multiple bits of data. More specifically, the r number of parity sectors 162 may be associated with the k number of data sectors 160 to derive a plurality of symbol-based outer code words 174. Each outer code word 174 may contain m number of symbols from each segment for correcting m number of symbols in each outer code word 174, wherein m is an integer greater than or equal to 1. For purposes of simplification, FIG. 10 illustrates RS outer code words 174 having eight symbols per sector (e.g., m=8).

Using the RS outer code illustrated in FIG. 10, it may be possible, in some instances, for more than the r number of inner code failures to be corrected. Even if inner code words 172 are not recoverable, most of the bits of inner code words 172 may be correct. Similarly, symbols in outer code words 174 that may be contained in failing inner code words 172 may be mostly error-free and many outer code words 174 can be corrected. More specifically, an outer code having r number of sectors 162 can correct r number of inner code failures using erasures, where an erasure may be referred to as knowing the location of a symbol. However, the outer code can correct many (e.g., m*r/2) outer code words 174 without using erasures.

As discussed above, each outer code word 174 includes eight symbols (e.g., m=8) per sector 160 and 162. With two r sectors (e.g., r=2) and each outer code word including eight symbols per parity sector 162, sixteen symbols of parity in each outer code word 174 can correct eight symbol errors (which may not be correctable by the inner code) without erasure. Although no symbol errors may exist in sectors 162, for purposes of simplification, it should be realized that parity sectors 162 can include symbol errors which may also have to be corrected in order to utilize outer code 168.

Given the correction capability discussed above, exemplary data track 130 may not recover all of the symbol errors using the inner code on its own or by using the outer code on its own. For example, the amount of symbol errors in each inner code word 172 may exceed the correction capability or correction reliability of inner code 166 and inner code recovery may be unable to recover these inner code words. Furthermore, outer code word 0 may include nine symbol errors 176 and outer code word 3 may include ten symbol errors 176. Therefore, the amount of symbol errors in these outer code words 176 may exceed the correction capability of outer code 168 and may be unable to recover these outer code words. However, the symbol errors in the exemplary embodiment illustrated in FIG. 9 may be corrected by iterating between using inner code 166 and outer code 168.

Using inner code 166 and outer code 168 to recover data and correct errors is called iterative outer code (IOC) recovery, which is performed at block 216 of composite data recovery procedure 200 shown in FIG. 4. For example, performing IOC may include a first iteration using inner code to correct symbol errors in a data track, such as data track 130. A first iteration using inner code includes selecting an inner code word 172 and determining whether inner code 166 can correct the select inner code word 172. In FIG. 10, inner code 166 may fail to correct the symbol errors 176 in each of inner code words 0, 1 and 2. Therefore, when each of these three inner code words 172 are selected, more inner code words 172 may need to be selected for analysis, such as inner code words 3 and 4. In FIG. 10, inner code 170 can correct errors in inner code words 3 and 4. Therefore, when each of these two inner codes words 172 is selected, inner code 166 or 170 (170 in the case of inner code words 3 and 4) may correct any errors in the select inner code word. While neither inner code words 3 nor 4 include symbol errors, if there were errors, they are correctable by inner code 170.

After the first iteration using inner code and with reference to the FIG. 10 example, inner code words 0, 1 and 2 may remain uncorrected. Therefore, performing IOC may also include performing a first iteration using outer code. A first iteration using outer code includes selecting an outer code word 174 and determining whether outer code 168 can correct the select outer code word 174. In FIG. 10, symbol errors 176 in each of outer code words 0 and 3 may exceed the correction capability of outer code 168 (e.g., each of outer code words 0 and 3 include more than eight symbol errors). Therefore, when each of these two outer code words 174 are selected, it may be determined that more outer code words 174 need to be selected for analysis. In the FIG. 10 example, such may be the case because outer code words 1 and 2 have yet to be analyzed. In FIG. 10, the amount of symbol errors in outer code words 1 and 2 may not exceed the correction capability of the outer code. In particular and as previously discussed, outer code words 1 and 2 may include 7 and 8 symbol errors. If any uncorrected outer code words 174 remain, a second iteration of error correction using inner code may be performed (discussed below). An indication that all outer code words 174 are corrected may be an indication that all inner code words 172 are corrected.

Figure 11:
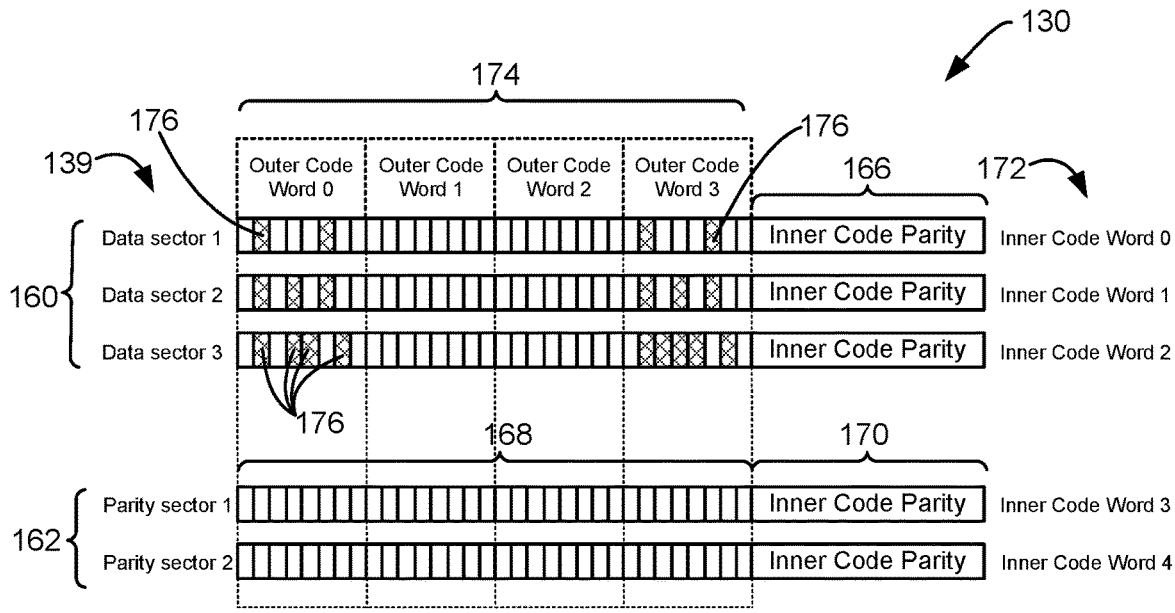
FIG. 11 illustrates a diagrammatic view of the data unit illustrated in FIG. 10 after data is recovered using a first iteration of inner code and a first iteration of outer code in accordance with certain embodiments.

FIG. 11 illustrates a diagrammatic view of data track 130 and the organization of groups of data after performing the first iteration of using inner code and the first iteration of using outer code on data track 130. In FIG. 11, outer code words 1 and 2 may be corrected, which may leave outer codes 0 and 3 uncorrected.

With more outer code word symbol errors to correct, IOC recovery includes performing a second iteration using inner code. The second iteration of using inner code include selecting an inner code word 172 and determining whether the inner code can correct the select inner code word. In FIG. 11, only the symbol errors 176 may not be corrected by inner code 166. In FIG. 11, the symbol errors in inner code words 0, 1, 3 and 4 may be corrected by the inner code. Inner code 166 or 170 (166 in the case of inner code words 0 and 1 and 170 in the case of inner code words 3 and 4) may correct errors in the select inner code word.

Figure 12:
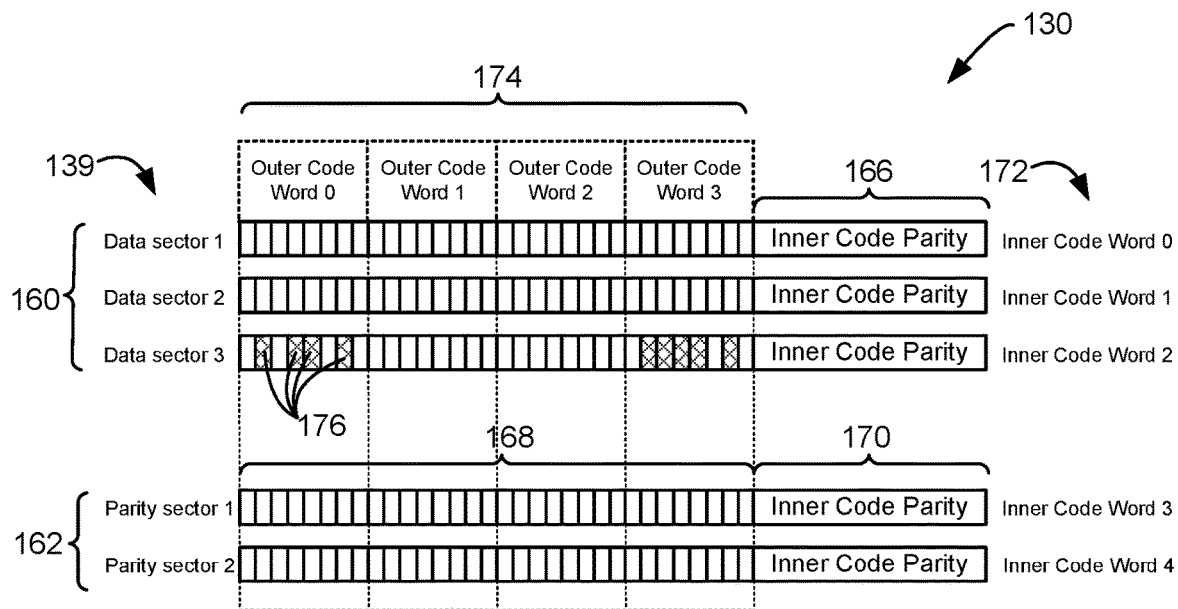
FIG. 12 illustrates a diagrammatic view of the data unit illustrated in FIG. 10 after data is recovered using a second iteration of inner code in accordance with certain embodiments.
Figure 13:
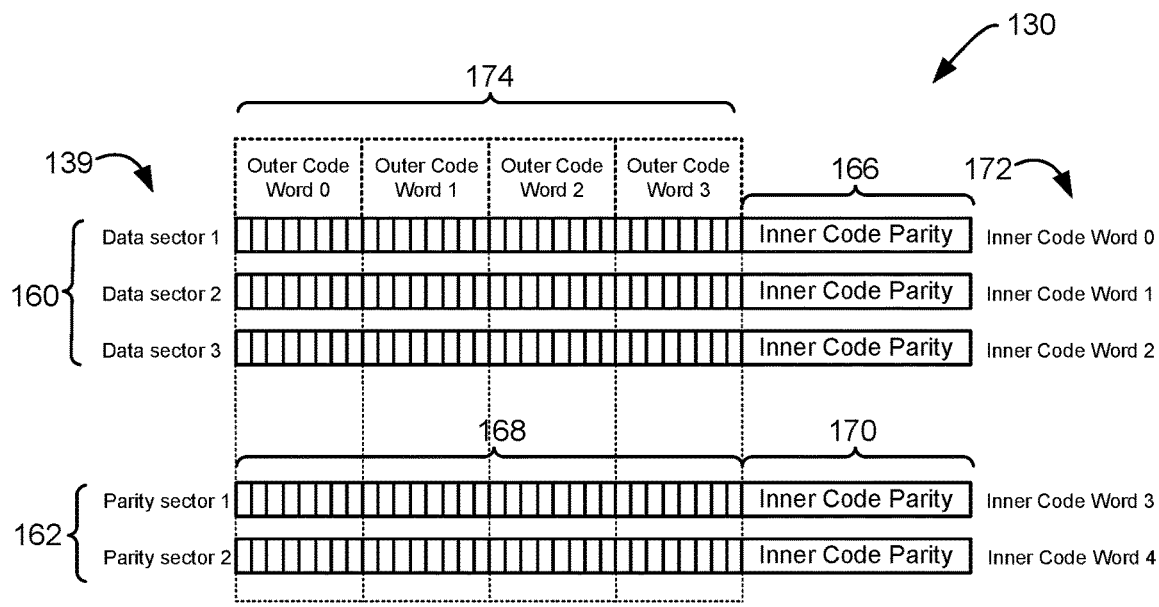
FIG. 13 illustrates a diagrammatic view of the data unit illustrated in FIG. 10 after data is recovered using a second iteration of outer code in accordance with certain embodiments.

In conjunction with the example illustration in FIG. 12, inner code word 2 may remain uncorrected. Therefore, a second iteration using outer code may be performed to correct symbol errors in data track 130. The second iteration using outer code includes selecting an outer code word 174 and determining whether the outer code can correct the select outer code word. In FIG. 11, if any of outer code words 174 exceed the correction capability of outer code 168 (e.g., each of outer code words 174 include more than eight symbol errors), then it is determined if more outer code words 174 remain to be selected for analysis. In FIG. 12, the amount of symbol errors in outer code words 0, 1, 2 and 3 may not exceed the correction capability of the outer code. In particular, outer code word 0 includes four symbol errors, outer code word 1 includes no symbol errors, outer code word 2 includes no symbol errors and outer code word 3 includes only five symbol errors. Therefore, the outer code 168 may correct the symbol errors in all outer code words 174. However, it may be determined that there are uncorrected outer code words 174. If so, a third iteration of error correction using the inner code is performed. As illustrated in FIG. 13, outer code words 174 have been corrected using first and second iterations of inner and outer code and therefore data in data track 130 has been recovered and procedure 200 has successfully performed data recovery.

Figure 14:
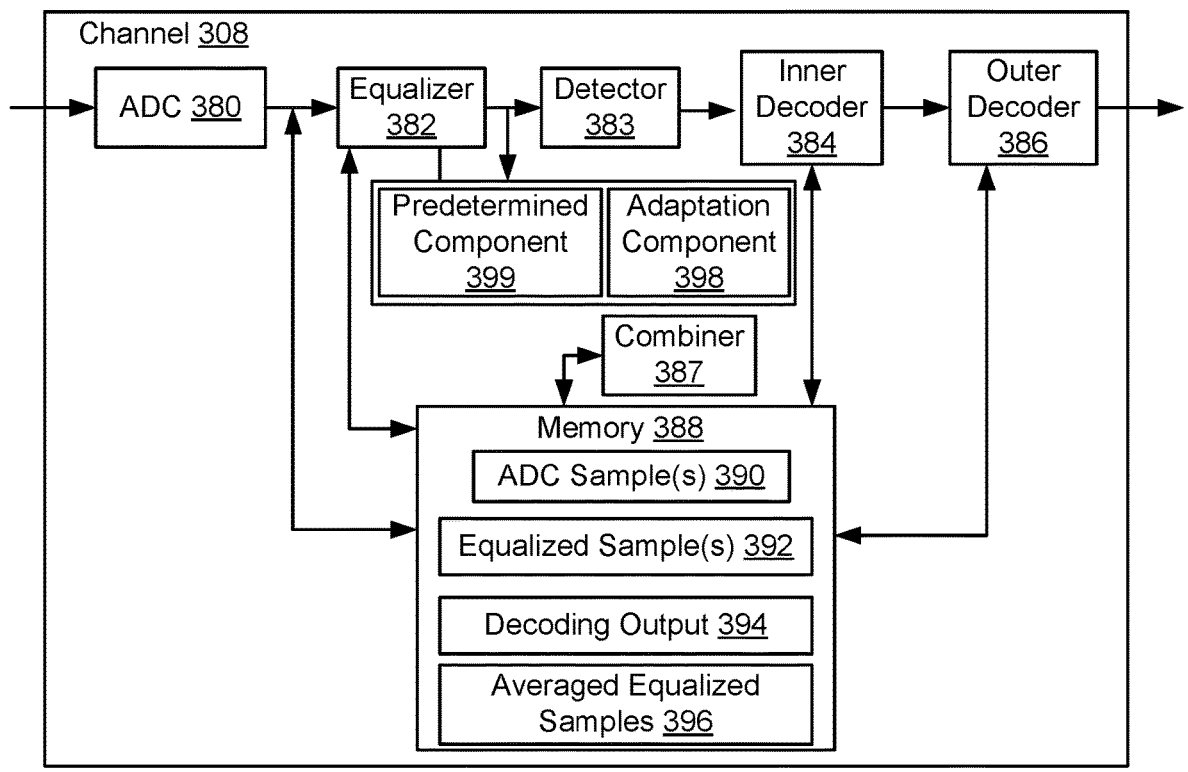
FIG. 14 is a simplified block diagram of an exemplary channel of a data storage device in accordance with certain embodiments.

FIG. 14 illustrates an exemplary block diagram of a channel 308, such as read/write channel 108 illustrated in FIG. 1, according to one embodiment. Channel 308 may include an ADC (analog-to-digital converter) 380, an equalizer 382, a detector 383, an inner decoder 384, an outer decoder 386, a combiner 387 and a memory 388. The general functions of the components of the channel 308 are discussed below in combination with the FIG. 4 composite data recovery procedure 200.

After an estimated reader offset position is determined from a first or second read attempt at block 202 and a decoding of failed data sectors(s) fails to recover the failed data sector(s), at block 208 one or more reads on the failed data sector(s) at the estimated reader offset position are performed to obtain one or more samples. If a single read is carried out, ADC 380 is configured to receive a time signal and generate an ADC sample 390. ADC sample 390 may be received by equalizer 382 and memory 388. Equalizer 382 may generate an equalized sample 392 based on ADC sample 390. If multiple reads are carried out, ADC 380 is configured to receive a continuous time signal and generate ADC samples 390. ADC samples 390 may be received by equalizer 382 and memory 388. Equalizer 382 may generate equalized samples 392 based on ADC samples 390.

At block 210, the one more samples are processed to obtain a processed sample. As discussed above, examples of multi-read processing includes X-averaging, SERV-averaging and/or RRA. Generally, in X-averaging, ADC (analog-to-digital converter) samples of the failed data sector(s) are averaged. The averaged ADC samples may be used to generate equalized averaged samples (e.g. using a finite impulse response (FIR) filter of combiner 387). In some embodiments, X-averaging may comprise three phases: (i) an acquisition phase (block 208), (ii) a replay phase (block 210), and (iii) a decode phase (block 212). In an acquisition phase (block 208), channel 308 may initiate reads of one or more failed data sector(s) at the estimated reader offset determined at block 202 to acquire ADC samples multiple times for averaging. For example, channel 308 may stage selective reads of the one or more failed data sector(s). In some examples, each failed data sector(s) ADC sample information may be stored in memory 388. As the averaged ADC samples may be acquired by reading the same data sectors multiple times (e.g. a predetermined number n times), in some examples, the ADC samples may be divided by n and accumulated as the samples are stored in the memory 388. In other examples, the ADC samples may be accumulated n times and then subsequently divided by n by combiner 387. At the end of this process, channel 308 may exit the acquisition phase (block 208) and move to the replay phase (block 210).

During the replay phase (block 210), combiner 387 may produce equalized samples for each failed data sector, for example, using a multiple input single output (MISO) filter. In some examples, channel 308 may also utilize least means square (LMS) adaptation in the MISO filter. At the end of each replay, the output of combiner 387 may be transferred to memory 388 as averaged samples 396. Channel 308 may perform m replays of the averaged ADC samples for a given failed segment to the MISO input to utilize LMS adaptation. At the end of the $m^{th}$ replay, channel 308 may stop the LMS adaptation and perform a final replay to acquire the final set of combined equalized samples for the failed data sector(s). The combined samples may then be stored in memory 388 for use in the decoding phase. Channel 308 may repeat the above replay phase (e.g. the LMS adaptation and combined sample generation) for each failed data sector. Channel 308 may then move to the decoding phase (block 212).

During the decoding phase, channel 308 may attempt to decode the failed data sector(s) using the averaged samples 396 from the replay phase for each failed segment. Upon successfully decoding failed data sector(s) as determined at block 212, channel 308 ends composite data recovery procedure 200. For failed data sector(s) that were recovered during the X-averaging decoding phase (block 212), channel 308 may discard ADC samples 390 and equalized samples 392 for the recovered data sector(s). For failed data sector(s) that were not recovered during the X-averaging decoding phase (block 212), channel 308 preserves averaged samples 396 so that IOC recovery performed in block 216 uses averaged samples 396.

As stated above, some embodiments may use SERV-averaging (e.g. in place of or in addition to X-averaging). In some examples, SERV-averaging of equalized samples may follow similar steps (blocks 208, 210 and 212) as outlined above for X-averaging with the following differences. In SERV averaging, combiner 387 may combine (e.g. average) multiple equalized samples in place of ADC samples. In addition, there may be no replay phase as the equalized samples may be averaged during the acquisition phase. The decoding phase of SERV-averaging may be similar to that of X-averaging.

As also stated above, some embodiments may use RRA (e.g., in place of or in addition to X-averaging and SERV-averaging). In some examples, RRA may follow similar steps (blocks 208, 210 and 212) as outlined above for X-averaging and SERV-averaging. However, in RRA, combiner 387 combines or averages samples in a particular manner, such as by using maximum-ratio combining to increase the signal-to-noise and yield better read samples to provide to a detector and decoder. In other words, RRA averages multiple noise realization together, to improve signal quality. The decoding phase of RRA may be similar to that of X-averaging and SERV-averaging.

At block 216, IOC is performed after the sample is processed, for example, by performing X-averaging, SERV-averaging and/or RRA. As discussed above, channel 308 operates to use the X-averaged, SERV-averaged and/or RRA equalized samples 396 stored in memory 388. Averaged equalized samples 396 are sent to detector 383 and then inner decoder 384. Detector 383 detects 1s and 0s from the equalized samples (waveforms). Detector 383 may be a Viterbi detector. When inner decoder 384 needs reliability information, a SOVA or Soft Output Viterbi may be used. In one embodiment, detector 383 may be included with inner decoder 384 since the LDPC decoder is also iterative, iterating between the detector and decoder. Inner decoding of failed data sector(s) is performed using the averaged equalized sample 396 to attempt to recover the failed data sector(s). Inner decoder 384 may generate decoding output 394. Decoding output 394 is then sent to outer decoder 386 and also to memory 388. Outer decoder 386 may use decoding output 394 and generate updated decoding output 394 that may be returned to memory 388 and also may be returned to inner decoder 384. The process may continue iteratively until, for example, until the failed data sector(s) converge or until a number of iterations have been performed without convergence. After IOC recovery is performed on the processed sample, composite data recovery procedure 200 ends.

Figure 15:
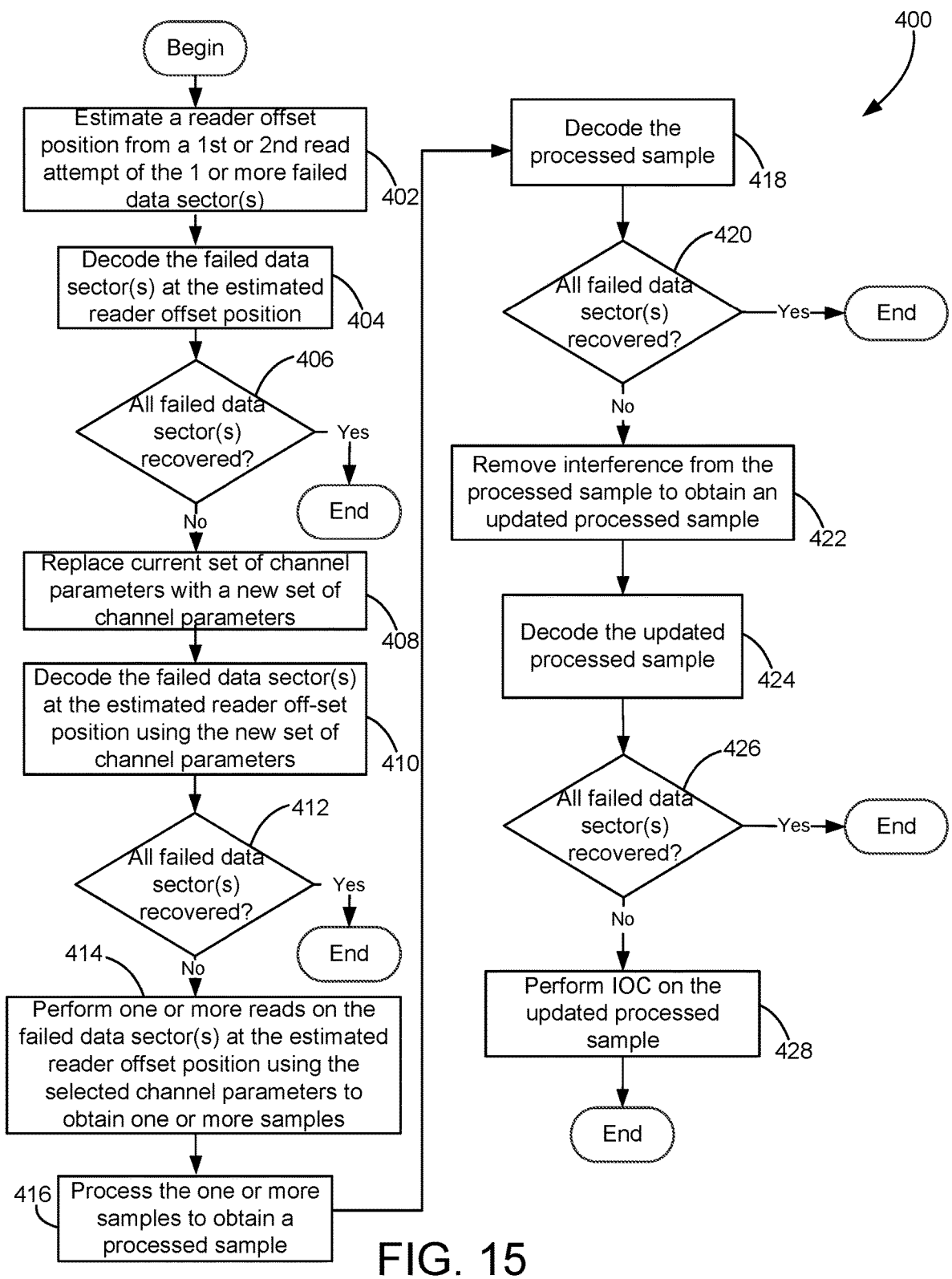
FIG. 15 illustrates a composite data recovery procedure according to another embodiment.

FIG. 15 illustrates a composite data recovery procedure 400 according to another embodiment. Composite data recovery procedure 400 may be initiated upon detection of one or more failed data sectors 139 on a first read attempt. At block 402, and similar to the FIG. 4 recovery procedure 200, a reader offset position is estimated from the first or a second read attempt and is based, at least in part, on a position error signal generated during the first or a second read attempt. With reference to FIGS. 5-8, the estimating of reader offset position at block 402 is described in detail above.

After estimating a reader offset position, procedure 400 passes to block 404 and decodes the failed data sector(s) 139 at the estimated reader offset position. At block 406, if all of the failed data sector(s) 139 are recovered, procedure 400 ends. If one or more of the failed data sector(s) 139 are not recovered, procedure 400 passes to block 408. At block 408, the current channel parameters are replaced. In particular, adapative methods or predetermined methods are used are used to find a new set of channel parameters. Predetermined methods include using predetermined paramaters based on various channel conditions.

Some memory devices, such as data storage media 106, that are based on the storage of charge experience degradation caused by various factors including the number of times that the memory cells are erased, among other factors. The degradation may result in a decreased ability to retain charge, and/or a greater sensitivity to mechanisms that may disturb the stored charge. As memory cells degrade, the read/write channel parameters used to access the memory cells may need to be modified to compensate for the aging memory cells in order to maintain a bit error rate.

For example, read channel 108 or 308 of FIG. 1 or 14 may utilize adaptive methods to modify channel parameters or may utilize precomputed or predetermined methods to modify channel parameters. A new set of channel parameters are then selected and used to replace the current set of channel parameters to decode failed data sector(s). In some multi-reader or multi-receiver systems, a detector may generate a data sequence based on an equalized sample sequence produced by equalizer 382, such as a MISO equalizer, that receives a plurality of digitized sample sequences corresponding to respective read heads. When using predetermined methods to modify channel parameters, a predetermined component 399 stores predetermined parameters based on various channel conditions and predetermined parameters are selected from predetermined component 399. When using adapative methods to modify channel parameters, an adaptation component 398 may include various adaptive functions or algorithms for adapting the parameters of the MISO equalizer. For example, the adaptive parameters may be coefficients or taps of a plurality of finite impulse response filters (FIRs). In some embodiments, a MISO equalizer may produce an equalized sample sequence based on parameters that were adapted using a regularized adaptation algorithm. In some examples, a regularized adaptation algorithm may utilize or may be based on a cost function that may penalize or dampen deviation from a precomputed set of parameter values (e.g. predetermined tap values). Other channel parameters may include the SOVA, Soft Output Viterbi Detector, front end filter coefficients. With reference to FIG. 14, there is analog circuitry before ADC 380 that functions to low-pass the analog read waveform. This is done through a low-pass filter. Changing the bandwidth and the boost associated with this low-pass filter is another way of changing the predetermined channel parameters. Other exemplary channel parameters may be reader bias parameters and preamp parameters.

At block 408, both adaptive and predetermined methods could be attempted and the method that provides the better quality metric may be selected. Examples include log-likelihood ratio (LLR) metrics, or soft-information metrics generated by the SOVA. Specifically, the average LLR or the number of LLRs with lower than a threshold could be used as a metric. Another metric is the mean-square error (MSE) at the equalizer output between the equalizer output and reconstructed samples. Yet another approach is to get reliability information by SOVA branch metric comparisons.

At block 408, the current set of channel parameters are replaced with a new set of channel parameters by using the adaptive and/or predetermined methods. At block 410, procedure 400 decodes the failed data sector(s) at the estimated reader off-set position using the new set of channel parameters. At block 412, if all of the failed data sector(s) 139 are recovered, procedure 400 ends. If one or more of the failed data sector(s) 139 are not recovered, procedure 400 passes to block 414. At block 414, one or more reads on the failed data sector(s) 139 at the estimated reader offset position using the new set of channel parameters are performed to obtain one or more samples. At block 416, the one or more samples are processed to obtain a processed sample. With reference to FIG. 14, the processing of one or more samples using, for example, sample averaging, is described in detail above. In another embodiment, processing of the one or more samples described in block 416 may also include keeping the best sample of the one or more samples and the averaged sample. In other words, each sample that was read at the reader off-set position and using the new set of channel parameters is compared to each other and to the averaged sample and the best sample is selected in the comparison to become the processed sample. Therefore, the processed sample may be a result of the one or more reads on the failed data sector(s) or it may be the averaged sample from the multiple reads on the failed data sector(s).

At block 418, the processed sample is decoded and passed to block 420. At block 420, if all of the failed data sector(s) 139 are recovered, procedure 400 ends. If one or more of the failed data sector(s) 139 are not recovered, procedure 400 stores the processed sample in buffer 112 and passes to block 422. At block 422, interference is removed from the processed sample.

With reference back to FIGS. 1 and 2, data storage medium 106 includes inner diameter 136 and outer diameter 138, between which are a number of concentric data tracks 130. As discussed above, information may be written to and read from the data tracks on data storage medium 106. Transducer head(s) 118 may be mounted on an actuator assembly that is operated by VCM 121. Transducer head(s) 118 may fly above surface 117 of data storage medium 106 during operation. The actuator assembly may rotate during a seek operation about the actuator axis of rotation positioned adjacent to data storage medium 106. The seek operation may position transducer head(s) 118 over a target data track of the data tracks.

In some instances, tracks may overlap. Channel 108 can include circuits and other elements that are utilized to cancel interference from adjacent tracks. Channel 108 may include similar functionality to that discussed above with regard to channel 308. In particular, failed data sectors in one of the overlapping tracks are adjacent to the adjacent sectors in the other of the overlapping tracks. In adjacent track interference cancellation (ATIC), interference from the adjacent sectors to failed data sector(s) may be determined and cancelled from the failed sectors.

In block 422, ATIC is performed to remove interference from the processed sample to obtain an updated processed sample. In one embodiment, channel 108 or 308 may determine the data sector indices in the adjacent track that are adjacent to the set of failed data sector(s) of the data unit of interest. Channel 108 or 308 may determine the data sector indices of the adjacent sectors as the sectors adjacent to failed sector(s). Channel 108 or 308 may also determine the overlap among the adjacent sectors with respect to the failed sector(s) and the overlap among the adjacent sectors with respect to failed sector(s).

Channel 108 or 308 may then save data for the current track and prepare to collect data for a skipped mask read of adjacent sectors of the adjacent track. For example, channel 108 or 308 may allocate storage for decoded data for the adjacent sectors from the adjacent track. Channel 108 or 308 may also disable an OC syndrome update function before the adjacent sectors are read. The read of the adjacent sectors may obtain both data and parity information. In some examples, the read of the adjacent sectors may be configured as a non-halting read operation to attempt to read the adjacent sectors in a same disc revolution. Data for the recovered sectors of the adjacent track may then be stored in the allocated storage. Once the skipped mask read is complete, channel 108 or 308 may generate adjacent decoding output data based on the portions of the adjacent sectors that overlap the failed sectors. For example, the later portion of the decoded data from an adjacent sector and the initial portion of the consecutive adjacent sector may be chosen based on the overlapping boundary information and may be used to form the final set of decoding output data for cancelling the adjacent track signal contribution from the samples in the failed sector(s). A similar determination may be performed for other failed sector(s). This process may be repeated for each failed sector of the processed sample.

Channel 108 or 308 may then restore the data for the current track and may enable the OC syndrome update function. Channel 108 or 308 may then apply the adjacent track cancellation data to the failed sector samples and, at block 424, decode the updated processed sample of the failed sector(s). At block 426, if all of the failed data sector(s) in the updated processed sample are recovered, procedure 400 ends. If one or more of the failed data sector(s) in the updated processed sample are not recovered, procedure 400 passes to block 428 to perform IOC recovery based on the improved or updated sample of the failed sectors that were not recovered. With reference to FIGS. 9-13, performing of IOC recovery as stated in block 428 is described in detail above.

It should be realized that in another embodiment the removal of interference as described in block 422 may take place before the one or more samples are processed to obtain a processed sample as described in block 416. In this embodiment, each read performed in block 414 may be saved and then ATIC performed on each read sample before the one or more samples are processed in block 416. For example, if the step of processing includes averaging the samples, then each read sample includes removed adjacent track interference and therefore the averaged sample will already include the removal of adjacent track interference. After processing and decoding of the sample with removed interference is completed and failed data sector(s) are still not recovered, then IOC is performed for or on the processed sample that already includes removed interference.

Figure 16:
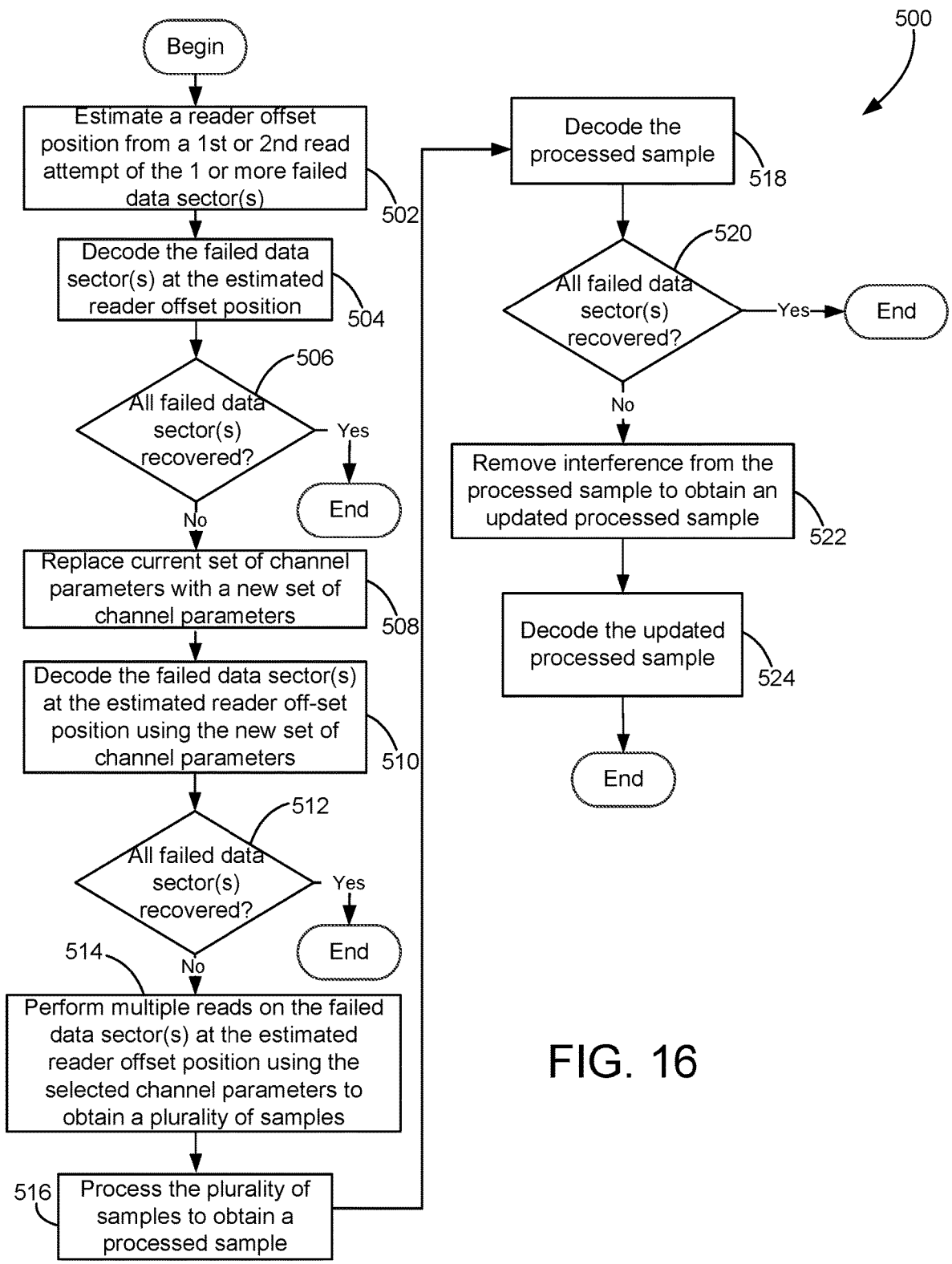
FIG. 16 illustrates a composite data recovery procedure according to yet another embodiment.

FIG. 16 illustrates a composite data recovery procedure 500 according to another embodiment. Composite data recovery procedure 500 may be initiated upon detection of one or more failed data sectors 139 on a first read attempt. At block 502, and similar to the FIG. 4 recovery procedure 200 and FIG. 15 recovery procedure 400, a reader offset position is estimated from the first or a second read attempt and is based, at least in part, on a position error signal generated during the first or a second read attempt. With reference to FIGS. 5-8, the estimating of reader offset position at block 502 is described in detail above.

After estimating a reader offset position, procedure 500 passes to block 504 and decodes the failed data sector(s) 139 at the estimated reader offset position. At block 506, if all of the failed data sector(s) 139 are recovered, procedure 500 ends. If one or more of the failed data sector(s) 139 are not recovered, procedure 500 passes to block 508. At block 508, the current set of channel parameters are replaced with a new set of channel parameters. As discussed above, current channel parameters are modified using adaptive methods and/or predetermined methods and a new set of channel parameters are selected.

At block 510, procedure 500 decodes the failed data sector(s) at the estimated reader off-set position using the selected channel parameters. At block 512, if all of the failed data sector(s) 139 are recovered, procedure 500 ends. If one or more of the failed data sector(s) 139 are not recovered, procedure 500 passes to block 514. At block 514, multiple reads on the failed data sector(s) 139 at the estimated reader offset position using the new set of channel parameters are performed to obtain a plurality of samples. At block 516, the plurality of samples are processed to obtain a processed sample. With reference to FIG. 14, sample averaging, is described in detail above as well as how the processed sample may be selected based on sample averaging.

At block 518, the processed sample is decoded and passed to block 520. At block 520, if all of the failed data sector(s) 139 are recovered, procedure 500 ends. If one or more of the failed data sector(s) 139 are not recovered, procedure 500 stores the processed sample in buffer 112 and passes to block 522. At block 522, interference is removed from the processed sample to obtain an updated processed sample. In block 522, ATIC is performed to remove interference from the processed sample to obtain an updated processed sample. A detailed discussion of ATIC is described above. At block 524 the updated processed sample is decoded. In one embodiment, iterative outer code recovery, as described above, may be performed on the updated processed sample.

Figure 17:
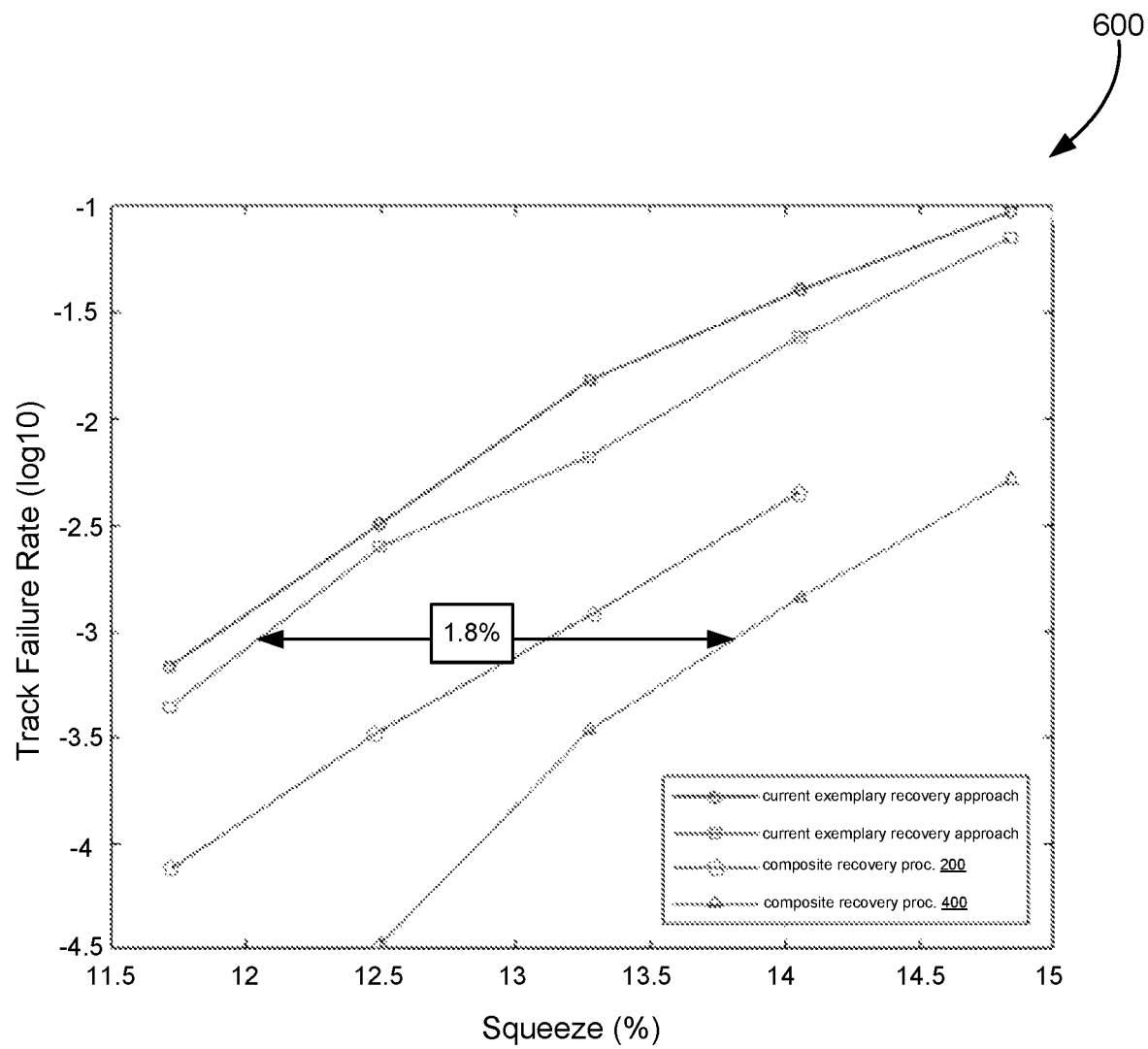
FIG. 17 illustrates a graphical representation that compares the results of current exemplary data recovery approaches to embodiments of composite data recovery procedures of the present disclosure.

FIG. 17 illustrates a graphical representation 600 that compares the results of prior art recovery approaches to composite data recovery procedures 200 and 400. As illustrated, there is an estimated 1.8% additional ADC gain in using composite data recovery procedure 400 to the second prior art recovery approach.

The illustrations of the embodiments described herein are intended to provide a general understanding of the structure and methods of the various embodiments. The illustrations are not intended to serve as a complete description of all of the elements and features of apparatus, methods and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be reduced. Accordingly, the disclosure and the figures are to be regarded as illustrative rather than restrictive.

One or more embodiments of the disclosure may be referred to herein, individually and/or collectively, by the term "invention" merely for convenience and without intending to limit the scope of this application to any particular invention or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The Abstract is provided to comply with 37 C.F.R. § 1.72(b) and is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments employ more features than are expressly recited in each claim. Rather, as the following claims reflect, inventive subject matter may be directed to less than all of the features of any of the disclosed embodiments.

The above-disclosed subject matter is to be considered illustrative, and not restrictive, and the appended claims are intended to cover all such modifications, enhancements, and other embodiments, which fall within the true spirit and scope of the present disclosure. Thus, to the extent allowed by law, the scope of the present disclosure is to be determined by the broadest permissible interpretation of the following claims and their equivalents, and shall not be restricted or limited by the foregoing detailed description.

What is claimed is:

1. A method comprising:
    designating one or more data sectors as failed data sectors when a first or a second read attempt on the one or more data sectors does not result in recovery of data from the one or more data sectors, wherein the data to be recovered is different from any position information;
    recovering the data from the one or more failed data sectors by:
        estimating a reader offset position from the first or the second read attempt of the one or more failed data sectors at a current set of channel parameters and basing the estimated reader offset position on, at least in part, a position error signal generated during the first or second read attempt;
        performing at least one read on the one or more failed data sectors at the estimated reader offset position to obtain one or more samples from a read waveform resulting from an attempt to read the data from the one or more failed data sectors during the performance of the at least one read on the one or more failed data sectors at the estimated reader offset position;
        processing the one or more samples to obtain a processed sample; and
        performing iterative outer code recovery on the processed sample.

2. The method of claim 1, further comprising replacing the current set of channel parameters with a new set of channel parameters selected from adaptive channel parameters or predetermined channel parameters.

3. The method of claim 2, wherein replacing the current set of channel parameters with the new set of channel parameters is carried out after estimating the reader offset position and before performing multiple reads at the estimated reader offset position.

4. The method of claim 1, wherein processing the one or more samples to obtain the processed sample comprises averaging the one or more samples to obtain the processed sample.

5. The method of claim 1, wherein processing the one or more samples to obtain the processed sample comprises averaging the one or more samples, comparing each sample to each other and to the averaged sample and selecting one of the samples or the averaged sample to be the processed sample.

6. The method of claim 1, further comprising storing the processed sample in a buffer.

7. The method of claim 6, further comprising removing interference from the processed sample to obtain an updated processed sample before performing the iterative outer code recovery, wherein interference is derived from one or more data sectors that are adjacent to the one or more failed data sectors.

8. The method of claim 7, wherein performing the iterative outer code recovery comprises performing the iterative outer code recovery on the updated processed sample.

9. The method of claim 1, further comprising removing interference from each of the at least one read before processing the one or more samples, wherein the interference is derived from an adjacent track having one or more data sectors that are adjacent to the one or more failed data sectors.

10. A method comprising:
designating one or more data sectors as failed data sectors when a first or a second read attempt on the one or more data sectors does not result in recovery of data from the one or more data sectors, wherein the data to be recovered is different from any position information;
recovering the data from the one or more failed data sectors by:
estimating a reader offset position from the first or the second read attempt of the one or more failed data sectors at a current set of channel parameters and basing the estimated reader offset position on, at least in part, a position error signal generated during the first or second read attempt;
replacing the current set of channel parameters with a new set of channel parameters selected from adaptive channel parameters or predetermined channel parameters;
performing at least one read on the one or more failed data sectors at the estimated reader offset position and using the new set of channel parameters to obtain one or more samples from a read waveform resulting from an attempt to read the data from the one or more failed data sectors during the performance of the at least one read on the one or more failed data sectors at the estimated reader offset position;
processing the one or more samples to obtain a processed sample; and
performing iterative outer code recovery on the processed sample.

11. The method of claim 10, wherein processing the one or more samples to obtain the processed sample comprises averaging the one or more samples to obtain the processed sample.

12. The method of claim 10, wherein processing the one or more samples to obtain the processed sample comprises averaging the one or more samples, comparing each sample to each other and to the averaged sample and selecting one of the samples or the averaged sample to become the processed sample.

13. The method of claim 10, further comprising removing interference from the processed sample to obtain an updated processed sample before performing iterative outer code recovery, wherein interference is derived from one or more data sectors that are adjacent to the one or more failed data sectors.

14. The method of claim 13, wherein performing iterative outer code recovery comprises performing iterative outer code recovery on the updated processed sample.

15. The method of claim 10, further comprising removing interference from each of the at least one read before processing the one or more samples, wherein the interference is derived from an adjacent track having one or more data sectors that are adjacent to the one or more failed data sectors.

16. A method comprising:
designating one or more data sectors as failed data sectors when a first or a second read attempt on the one or more data sectors does not result in recovery of data from the one or more data sectors, wherein the data to be recovered is different from any position information;
recovering the data from the one or more failed data sectors by:
estimating a reader offset position from the first or the second read attempt of the one or more failed data sectors at a current set of channel parameters and basing the estimated reader offset position on, at least in part, a position error signal generated during the first or second read attempt;
replacing the current set of channel parameters with a new set of channel parameters selected from adaptive channel parameters or predetermined channel parameters;
performing multiple reads on the one or more failed data sectors at the estimated reader offset position and using the new set of channel parameters to obtain a plurality of samples from read waveforms resulting from attempts to read the data from the one or more failed data sectors during the performance of the multiple reads on the one or more failed data sectors at the estimated reader offset position;
processing the plurality of samples to obtain a processed sample; and
removing interference from the processed sample to obtain an updated processed sample, wherein the interference is derived from an adjacent track having one or more data sectors that are adjacent to the one or more failed data sectors.

17. The method of claim 16, wherein processing the plurality of samples to obtain the processed sample comprises averaging the plurality of samples to obtain the processed sample.

18. The method of claim 16, wherein processing the plurality of samples to obtain the processed sample comprises averaging the plurality of samples, comparing each sample to each other and to the averaged sample and selecting one of the samples or the averaged sample to be the processed sample.

19. The method of claim 16, further comprising storing the processed sample in a buffer before removing interference from the processed sample.

20. The method of claim 16, further comprising performing iterative outer code recovery on the updated processed sample.

* * * * *